(12) United States Patent
Sakai

(10) Patent No.: US 7,714,980 B2
(45) Date of Patent: May 11, 2010

(54) EXPOSURE APPARATUS, EXPOSURE METHOD, AND EXPOSURE SYSTEM

(75) Inventor: Keita Sakai, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 86 days.

(21) Appl. No.: 11/675,162

(22) Filed: Feb. 15, 2007

(65) Prior Publication Data

US 2007/0188725 A1 Aug. 16, 2007

(30) Foreign Application Priority Data

| Feb. 15, 2006 | (JP) | ............................ 2006-037423 |
| Dec. 28, 2006 | (JP) | ............................ 2006-353587 |
| Feb. 6, 2007 | (JP) | ............................ 2007-026405 |

(51) Int. Cl.
*G03B 27/52* (2006.01)
*G03B 27/42* (2006.01)

(52) U.S. Cl. .......................................... 355/30; 355/53

(58) Field of Classification Search .................. 355/30, 355/52, 53, 55, 67
See application file for complete search history.

(56) References Cited

U.S. PATENT DOCUMENTS

| 4,346,164 | A | | 8/1982 | Tabarelli et al. |
| 5,610,683 | A | * | 3/1997 | Takahashi ..................... 355/53 |
| 7,038,759 | B2 | | 5/2006 | Emoto et al. |
| 7,195,860 | B2 | | 3/2007 | Endo et al. |
| 2002/0145711 | A1 | * | 10/2002 | Magome et al. ............... 355/30 |
| 2005/0074704 | A1 | | 4/2005 | Endo et al. |
| 2005/0078286 | A1 | * | 4/2005 | Dierichs et al. ............... 355/30 |
| 2005/0185155 | A1 | * | 8/2005 | Kishikawa ................... 355/30 |
| 2005/0275817 | A1 | | 12/2005 | Nakata |
| 2007/0009841 | A1 | | 1/2007 | Endo et al. |

FOREIGN PATENT DOCUMENTS

| JP | 2003-022955 | 1/2003 |
| JP | 2005-136374 | 5/2005 |
| JP | 2006-004964 | 1/2006 |
| JP | 2005-327975 | 11/2006 |
| WO | 2005/119371 | 12/2005 |

* cited by examiner

*Primary Examiner*—Hung Henry Nguyen
(74) *Attorney, Agent, or Firm*—Rossi, Kimms & McDowell LLP

(57) ABSTRACT

An exposure apparatus has a projection optical system configured to project an image of a reticle pattern onto a substrate, and exposes the substrate via liquid supplied to a space between the substrate and the projection optical system. The exposure apparatus includes an oxygen removal unit configured to reduce dissolved oxygen in the liquid by bringing the liquid into contact with a gas other than oxygen, and a degassing unit configured to reduce a dissolved gas in the liquid.

13 Claims, 10 Drawing Sheets

EXPOSURE APPARATUS, EXPOSURE METHOD, AND EXPOSURE SYSTEM

BACKGROUND OF THE INVENTION

The present invention relates to an exposure apparatus, an exposure method, and an exposure system.

A conventional reduction projection exposure apparatus projects a circuit pattern of a reticle (mask) onto a wafer or another substrate via a projection optical system in manufacturing fine devices, such as a semiconductor memory and a logic circuit, using the photolithography technology.

The minimum critical dimension ("CD") (or a resolution) transferable by the reduction projection exposure apparatus is proportionate to a wavelength of the light used for exposure, and inversely proportionate to the numerical aperture ("NA") of the projection optical system. The shorter the wavelength is and the higher the NA is, the smaller the resolution is. Along with the recent demand for the fine processing to a semiconductor device, use of a shorter wavelength of the exposure light is promoted. For example, use of the ultraviolet ("UV") light having a shorter wavelength is promoted from a KrF excimer laser (with a wavelength of approximately 248 nm) to an ArF excimer laser (with a wavelength of approximately 193 nm).

With this background, the immersion exposure is one attractive resolution improving technology that uses a light source, such as the ArF excimer laser. The immersion exposure increases an apparent NA of the projection optical system and improves the resolution by filling the liquid in a space between the final lens of the projection optical system and the wafer (or by replacing the medium at the wafer side of the projection optical system with the liquid) and by shortening the effective wavelength of the exposure light. The NA of the projection optical system is defined as $NA = n \times \sin\theta$, where $n$ is a refractive index of the medium. The NA increases up to $n$ when the medium has a refractive index higher than the air's refractive index, i.e., $n > 1$.

Since liquid having a higher refractive index is expected to provide a higher resolution, an immersion exposure apparatus that uses liquid having a high refractive index ("high refractive index ("HRI") liquid") is proposed as a successor technology of an immersion exposure apparatus. See Japanese Patent Application No. 2006-4964.

However, as a result of a comparison between pure water and the HRI liquid, this inventor has discovered that the immersion exposure apparatus that uses the HRI liquid poses the following problems different from the immersion exposure apparatus that uses the pure water:

The first problem about the immersion exposure apparatus that uses the HRI liquid is a necessity of a recycle of the liquid because the HRI liquid is more expensive than pure water and more influential to the environment.

Some immersion exposure apparatuses that circulate the liquid have already been proposed. See U.S. Pat. No. 4,346,164 and Japanese Patent Application, Publication No. 2005-136374.

Each of the immersion exposure apparatuses disclosed in these references removes impurities from the recovered liquid (or purifies it by the purifier), and recycles the liquid. In general, a detector that detects the purity of the purified liquid sits subsequent to the purifier. For example, Japanese Patent Application, Publication No. 2005-136374 proposes a method for detecting a particle amount and an impurity amount, and a method for measuring a physical characteristic, such as an electric resistance and a refractive index. However, studies by this inventor have revealed that this detector cannot precisely detect the purity of the liquid. In other words, the conventional immersion exposure apparatus cannot well guarantee that the circulated or recycled liquid has good quality, and may recycle liquid that is too inferior to recycle. This is a peculiar problem to the immersion exposure apparatus that uses the HRI liquid to circulate the high quality liquid, and is irrelevant to the immersion exposure apparatus that uses pure water.

The second problem that uses the HRI liquid is that the HRI liquid's transmittance is likely to degrade. Oxygen is more likely to dissolve in the HRI liquid than in the pure water, and thus the HRI liquid remarkably reduces the transmittance to the UV wavelength range when exposed to the air. Although the conventional immersion exposure apparatus includes a degassing unit that reduces all dissolved gases to restrain gas bubbles, the degassing unit cannot well eliminate dissolved oxygen, and a small amount of dissolved oxygen residue reduces the liquid's transmittance. In addition, it is feared that a reaction, such as decomposition due to the exposure light causes a drop of the transmittance. As the liquid's transmittance reduces, its temperature rises due to the absorption of the exposure light and its refractive index changes, causing the exposure aberration. Strict control over the liquid's transmittance is required to secure the exposure or imaging characteristic. In correcting an exposure aberration caused by the liquid temperature change, it is preferable to maintain the liquid's transmittance constant. When the liquid's fluctuates, an amount of aberrational correction needs to be controlled in accordance with the fluctuation.

SUMMARY OF THE INVENTION

The present invention is directed to an exposure apparatus that reduces a fluctuation of the liquid's transmittance.

An exposure apparatus according to one aspect of the present invention includes comprising a projection optical system configured to project an image of a reticle pattern onto a substrate, the exposure apparatus exposing the substrate via liquid supplied to a space between the substrate and the projection optical system, an oxygen removal unit configured to reduce dissolved oxygen in the liquid by bringing the liquid into contact with a gas other than oxygen, and a degassing unit configured to reduce a dissolved gas in the liquid.

A further object and other characteristics of the present invention will be made clear by the preferred embodiments described below referring to accompanying drawings.

DESCRIPTION OF THE EMBODIMENTS

Figure 1:
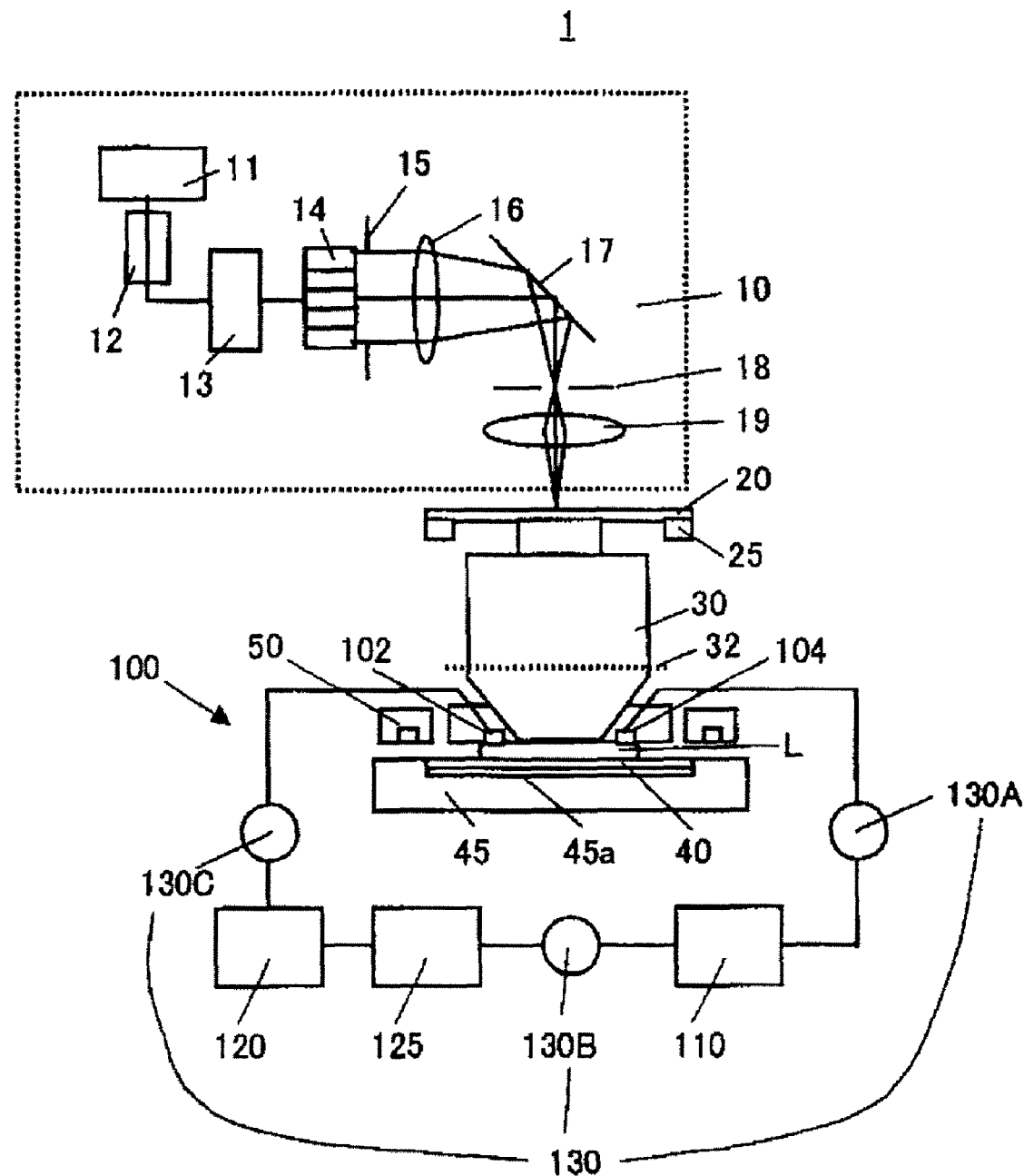
FIG. 1 is a schematic block diagram showing a structure of an exposure apparatus according to one aspect of the present invention.

Referring now to the accompanying drawings, a description will be given of an exposure apparatus according to one aspect of the present invention. In each figure, the same reference numeral designates the same element, and a duplicate description thereof will be omitted. Here, FIG. 1 is a schematic block diagram showing a structure of the exposure apparatus 1 according to the present invention.

The exposure apparatus 1 includes, as shown in FIG. 1, an illumination apparatus 10, a reticle stage 25 mounted with a reticle 20, a projection optical system 30, a wafer stage 45 mounted with a wafer 40, and a circulator 100.

The exposure apparatus 1 is an immersion exposure apparatus that exposes a pattern of the reticle 20 onto the wafer 40 via liquid L that is supplied to a space between the wafer 40 and an optical element or final lens of the projection optical system 30, which final lens is closest to the wafer 40 among the optical elements in the projection optical system 30. The exposure apparatus 1 uses a step-and-scan exposure manner to expose the wafer 40. However, the exposure apparatus 1 can use a step-and-repeat manner.

The illumination apparatus 10 illuminates the reticle 20, on which a circuit pattern to be transferred is formed, and includes a light source section and an illumination optical system.

The light source section includes a laser 11 as a light source and a beam shaping optical system 12. The laser 11 uses an ArF excimer laser with a wavelength of approximately 193 nm, an KrF excimer laser with a wavelength of approximately 243 nm, and an $F_2$ laser with a wavelength of approximately 157 nm. This embodiment uses an ArF excimer laser with a wavelength of approximately 193 nm for the light source. The type of the laser 11 and the number of lasers are not limited. The type of the light source is not also limited.

The beam shaping optical system 12 converts an aspect ratio of the light from the laser 11. The beam shaping optical system 12 forms the light having a size and a divergent angle necessary to illuminate the optical integrator 14.

The illumination optical system is an optical system that illuminates the reticle 20, and includes a condenser optical system 13, an optical integrator 14, an aperture stop 15, a condenser lens 16, a deflection mirror 17, a masking blade 18, and an imaging lens 19. The illumination optical system can realize various illumination modes, such as an annular illumination and a quadrupole illumination.

The condenser optical system 13 efficiently introduces the light having a desired shape to the optical integrator 14. The condenser optical system 13 includes an exposure dose adjuster that can adjust the exposure dose of the reticle 20.

The optical integrator 14 makes uniform the illumination light used to illuminate the reticle 20, and is a fly-eye lens in this embodiment.

The aperture stop 15 is conjugate with the pupil plane 32 of the projection optical system 30. The aperture shape of the aperture stop 15 corresponds to an effective light source shape on the pupil plane 32 in the projection optical system 30.

The condenser lens 16 condenses plural rays emitted from the secondary light source near the exit plane of the optical integrator 14.

The mirror 17 reflects the light condensed by the condenser lens 16. The masking blade 18 is uniformly illuminated by the plural rays.

The masking blade 18 is a field stop that includes plural movable light shielding plates, and has an aperture having an approximately rectangular shape corresponding to the effective area of the projection optical system 30. The light that has transmitted through the opening of the masking blade 18 is used as the illumination light to illuminate the reticle 20.

The imaging lens 19 images the opening shape of the masking blade 18 onto the reticle 20.

The reticle 20 has a pattern used to expose the wafer 40.

The reticle stage 25 supports the reticle 20.

The projection optical system 30 projects an image of the pattern of the reticle 20 onto the wafer 40. The projection optical system 30 can use a dioptric or catadioptric system. The final lens closest to the wafer in the projection optical system 30 can be a planoconvex lens or a meniscus lens.

A photoresist is applied to the surface of the wafer 40. This embodiment uses a wafer for the substrate, but the substrate may use for a substrate a glass plate and another substrate.

The wafer stage 45 supports the wafer 40 via a holder, such as a wafer chuck.

The circulator 100 supplies the liquid L to the space between the final lens of the projection optical system 30 and the wafer 40 via a supply nozzle 102, and collects the liquid L from the space between them via a recovery nozzle 104.

The oxygen diluter 50 supplies a gas other than oxygen around the liquid L, and makes the oxygen concentration around the liquid L lower than that of air. The gas supplied by the oxygen diluter 50 preferably has a high transmittance to the exposure light, and can use, for example, nitrogen, helium, and argon. Inexpensive nitrogen is preferable due to a large consumption amount of the gas. The reduced oxygen concentration around the liquid L restrains a transmittance drop of the liquid L which is otherwise caused by the dissolved oxygen.

The liquid L has a good transmittance to the wavelength of the exposure light, is less likely to contaminate the projection optical system 30, and matches the resist process. The liquid L can be pure water and hydrocarbon liquid, and a proper material is selected in accordance with the applied photoresist on the wafer 40 and the wavelength of the exposure light. Coating may be applied to the final lens of the projection optical system 30 so as to protect the lens from the liquid L.

The circulator 100 includes a purifier 110 that is configured to improve the purity of the recovered liquid L, an oxygen removal unit 120 that removes dissolved oxygen in the liquid L, a degassing unit 125 that removes the dissolved gas in the liquid L, and a measurement unit 130 that measures the transmittance of the liquid L. The measurement unit 130 in this embodiment includes three measurement units 130A to 130C. The circulator 100 includes a pump that feeds the liquid L, a flow controller that controls a transfer amount of the liquid L, a temperature controller that controls the temperature of the liquid L, and a mixer that mixes new liquid with the liquid L that has been collected and purified.

The oxygen removal unit 120 can use a bubbler that removes dissolved oxygen through bubbling of the gases other than oxygen. The gas used for the bubbler preferably has a high transmittance to the exposure light, and uses, for example, nitrogen, helium, and argon. In addition to bubbling, an agitation of the liquid in a bubbling vessel efficiently provides oxygen removal. Fine bubbles generated with a porous member would increase the area of the liquid that contacts the gas for efficient oxygen removal. The porous member can be made of such a material as polytetrafluoroethylene ("PTFE"), SUS, SiO$_2$, and SiC.

The oxygen removal unit 120 may use any means as long as it brings the gas other than oxygen into contact with the liquid L. For example, the liquid L may be poured in the vessel and agitated with the gas other than oxygen flowed. Alternatively, fine droplets of the liquid L are supplied to an atmosphere of the gas other than oxygen.

The degassing unit 125 may use a degassing filter that removes the dissolved gas that flows the liquid through one end of a gas transmitting film, and decompresses the other end. The gas transmitting film may be made of fluoric resin, such as PTFE. In order to increase the contact area between the gas transmitting film and the liquid, the gas transmitting film may be worked into a hollow thread with a diameter of about 100 μm. When the outside of the hollow thread is decompressed and the liquid is flowed in dozens or hundreds of fluoric resin hollow threads, the dissolved gas can be efficiently removed. An alternative embodiment decompresses the inside of the hollow thread and flows the liquid outside the hollow thread. One object of the degassing unit 125 is to reduce the dissolved gas concentration, and to shorten the lifetime of a gas bubble. As a result, an exposure defect due to the gas bubble can be prevented.

The oxygen removal unit 120 can also shorten the gas bubble's lifetime with a gas different in type from that supplied by the oxygen diluter 50. The gas around the liquid L supplied to the space between the final lens of the projection optical system 30 and the wafer 40 is replaced with nitrogen, for example, by the oxygen diluter 50. Therefore, gas bubbles generated from the liquid L on the wafer 40 are nitrogen bubbles. For the shortened nitrogen bubble's lifetime, the nitrogen concentration in the liquid L is reduced. The nitrogen concentration in the liquid L reduces through bubbling with a gas other than nitrogen, such as helium, and the nitrogen bubble's lifetime shortens. Since the bubbling gas is saturated in the liquid, the bubbling gas component can cause gas bubbles due to the pressure and temperature fluctuations. Hence, the degassing unit 125 preferably sits after the oxygen removal unit 120. Since the gas other than nitrogen, such as helium, is more expensive than nitrogen, two oxygen removal units 120 are arranged in series for oxygen removal through nitrogen bubbling and for nitrogen removal through helium bubbling. Nitrogen bubbling prior to helium bubbling can reduce usage of the helium gas.

When only the degassing unit 125 shortens the gas bubble's lifetime, an increase of its size is concerned. A size of a liquid transfer pump can also increase so as to handle a high pressure loss. In addition to the degassing unit 125, types of gases used for the oxygen diluter 50 and the oxygen removal unit 120 are changed to restrain a large size of the degassing unit 125, and to prevent the exposure defect due to the gas bubbles.

The measurement unit 130 uses, to measure the transmittance of the liquid L, a method for flowing the liquid L through a cell made of a light transmitting material, such as fused silica and for measuring the transmittance of cell. The transmittance to be measured is the transmittance to the wavelength of the exposure light, and preferably the transmittance to the wavelength of about 248 nm when the KrF excimer laser is used or to the wavelength of about 193 nm when the ArF excimer laser is used. The measurement unit 130 uses a universal spectrophotometer that is configured to select a wavelength of the exposure light using a diffraction grating and a light source, such as a D2 lamp, to introduce the light to the cell, and to detect the transmission light with a light receiver, such as a photomultiplier.

The transmittance to the wavelength of the exposure light for some types of liquid L can be predicted from the transmittance to another wavelength. In that case, the measurement unit 130 can be configured to measure the transmittance to a wavelength of the light other than the exposure light. For example, depending upon the wavelength, the emission lines of the excimer laser (172 nm) and the low-pressure mercury lamp (185 nm) can be utilized, and a spectrometer can be omitted. The measurement unit 130 can properly use a double-beam method with a chopper, a lock-in amplifier method, a method for measuring the light intensity before and after the cell in order to improve the measurement precision. Similarly, from the improved measurement precision, the measurement thickness of the liquid L is between 1 mm and 100 mm, preferably between 10 mm and 50 mm.

The measurement unit 130A measures the transmittance of the liquid L recovered from the exposure position used to expose the wafer 40. The measurement unit 130B measures the transmittance of the liquid L purified by the purifier 110. The measurement unit 130C measures the transmittance of the liquid L supplied to the space between the projection optical system 30 and the wafer 40.

Figure 2:
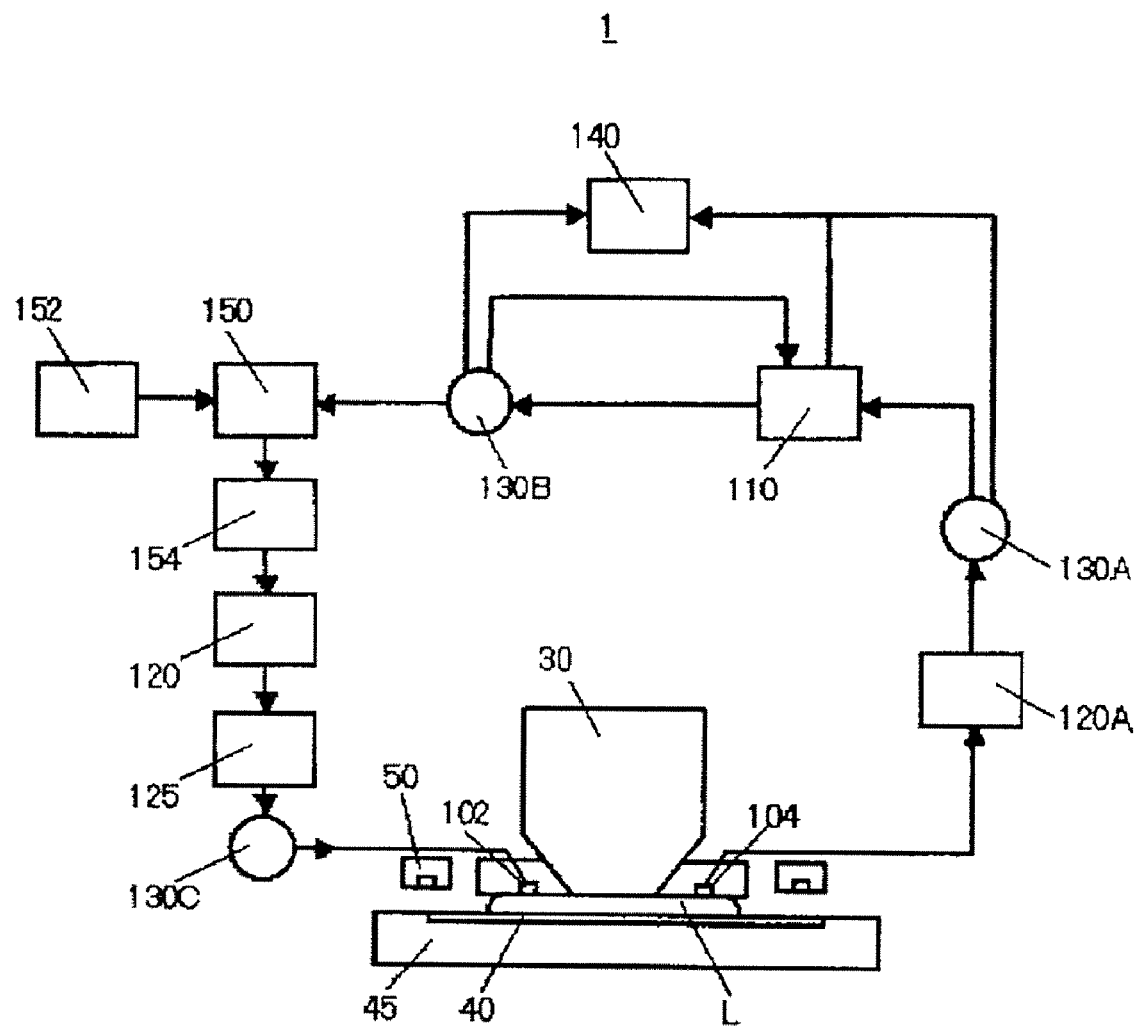
FIG. 2 is a partial block diagram that shows part of the structure of the exposure apparatus shown in FIG. 1.

FIG. 2 is a partial block diagram that shows part of the structure of the exposure apparatus 1. FIG. 2 shows the projection optical system 30, the wafer 40, the wafer stage 45, the liquid L, and the circulator 100.

In the circulator 100, the oxygen removal unit 120A processes the liquid L recovered from the recovery nozzle 104, and the measurement unit 130A measures the transmittance. The liquid L having a high transmittance value measured by the measurement unit 130A is transferred to the purifier 110. On the other hand, the liquid L having a low transmittance value measured by the measurement unit 130A is transferred to a waste-liquid tank 140.

The measurement unit 130B measures the transmittance of the liquid L purified by the purifier 110. The liquid L having a high transmittance value measured by the measurement unit 130B is transferred to a mixer 150. On the other hand, the liquid L having a low transmittance value measured by the measurement unit 130B is transferred back to the purifier 110. The liquid L having an extremely low transmittance value is transferred to the liquid-waste tank 140. The liquid waste that contains impurities and is exhausted during the purification of the purifier 110 is also transferred to the liquid-waste tank 140.

The mixer 150 mixes the new liquid supplied from a new liquid tank 152 with the liquid L purified by the purifier 110. A mixture ratio between the new liquid and the liquid L is determined based on the transmittance value of the liquid L measured by the measurement unit 130B, and the new liquid and the liquid L is mixed by that determined mixture ratio.

The mixed liquid is stored in the supply tank 154. The oxygen removal unit 120 processes the liquid L supplied from the supply tank 154. While FIG. 2 separates the supply tank 154 from the oxygen removal unit 120, the supply tank 154 may have a bubbler as an oxygen removal unit for oxygen removal. The degassing unit 125 on the downstream side of the oxygen removal unit 120 reduces the dissolved gas in the liquid L. The measurement unit 130C measures the transmittance of the oxygen removed and degassed liquid L. The amount of aberrational corrections of the focus and exposure dose are determined based on the transmittance of the liquid L measured by the measurement unit 130C, and corrected before exposure. The degassing unit 125 may be provided on the downstream side of the measurement unit 130C.

A detailed description will now be given of various embodiments of the circulator 100.

First Embodiment

Figure 3:
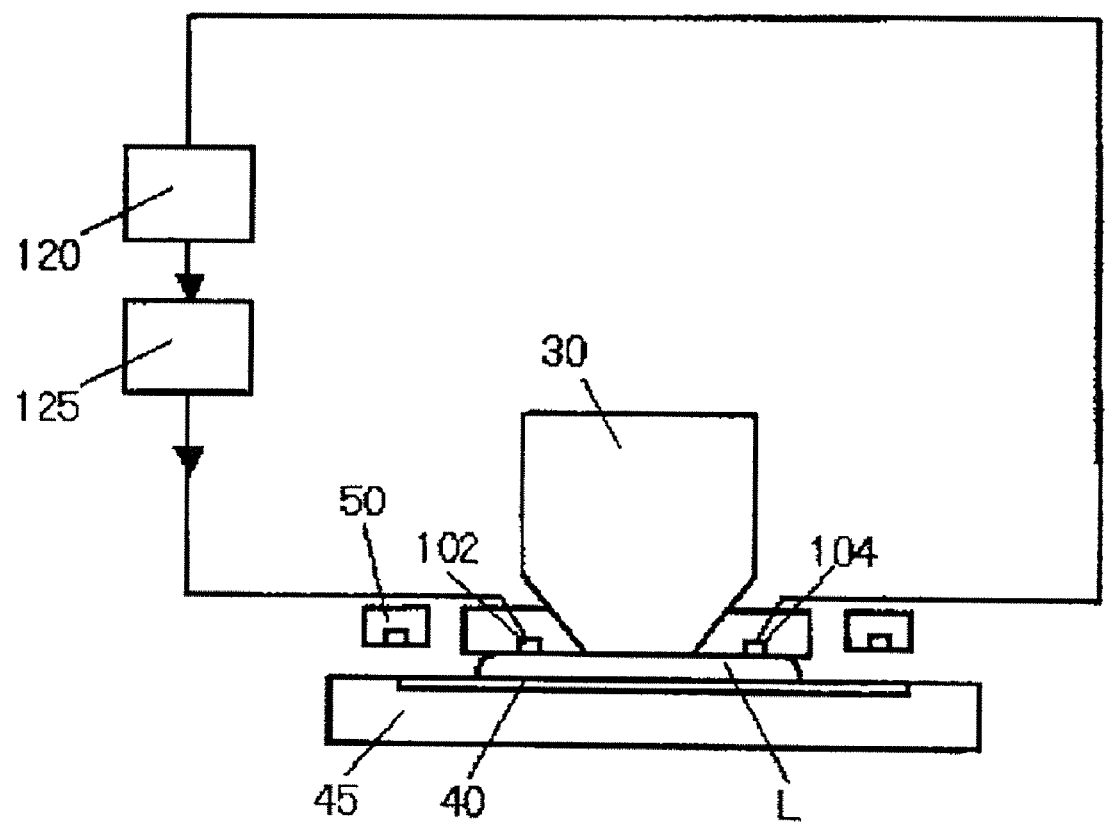
FIG. 3 is a partial block diagram that shows part of the structure of the exposure apparatus shown in FIG. 1.

The circulator 100 of a first embodiment includes, as shown in FIG. 3, a nitrogen bubbler (oxygen removal unit) 120, and a degassing filter (degassing unit) 125. FIG. 3 is a partial block diagram showing part of a structure of the exposure apparatus 1.

The exposure apparatus 1 of the first embodiment uses hydrocarbonaceous HRI liquid having a refractive index of 1.64 for the liquid L to be supplied to the space between the projection optical system 30 and the wafer 40.

The atmosphere around the exposure position in the exposure apparatus 1 is replaced with nitrogen by the oxygen diluter 50, but a small amount of oxygen that dissolves in the liquid L reduces the transmittance of the liquid L. The dissolved oxygen concentration in the liquid L that is measured just before the exposure position is below 0.1 ppm when both the nitrogen bubbler 120 and the degassing filter 125 work. The dissolved oxygen concentration in the liquid L that is measured just before the exposure position is 2 ppm when the nitrogen bubbler 120 stops and the degassing filter 125 works. The dissolved oxygen concentration of 2 ppm lowers the transmittance of the liquid L by about 0.7%/mm and greatly contributes to the generated aberrational amount. Thus, the exposure apparatus having only the degassing filter 125 cannot provide a superior imaging characteristic. On the other hand, the exposure apparatus that includes the nitrogen bubbler 120 in addition to the degassing filter 125 can supply the liquid L having a high transmittance, and provides a superior imaging characteristic.

Second Embodiment

Similar to FIG. 3 in the first embodiment, the circulator 100 of the second embodiment has the bubbler (oxygen removal unit) 120 and the degassing filter (degassing unit) 125, although the bubbler uses helium.

The exposure apparatus 1 of a second embodiment uses hydrocarbonaceous HRI liquid having a refractive index of 1.64 for the liquid L that is supplied to the space between the projection optical system 30 and the wafer 40.

The environment around the exposure position in the exposure apparatus 1 is replaced with nitrogen by the oxygen diluter 50, but a small amount of oxygen that dissolves in the liquid L lowers the transmittance of the liquid L. The dissolved oxygen concentration in the liquid L that is measured just before the exposure position is below 0.1 ppm when both the helium bubbler 120 and the degassing filter 125 work. The dissolved oxygen concentration in the liquid L that is measured just before the exposure position is 2 ppm when the helium bubbler 120 stops and the degassing filter 125 works. The dissolved oxygen concentration of 2 ppm lowers the transmittance of the liquid L by about 0.7%/mm, and greatly contributes to the generated aberrational amount. Thus, the exposure apparatus having only the degassing filter 125 cannot provide a superior imaging characteristic. On the other hand, the exposure apparatus that includes the nitrogen bubbler 120 in addition to the degassing filter 125 can supply the liquid L having a high transmittance, and provides a superior imaging characteristic. In addition, a difference of the used gas between the oxygen diluter 50 and the oxygen removal unit 120 restrains a defect caused by the gas bubble.

Third Embodiment

Figure 4:
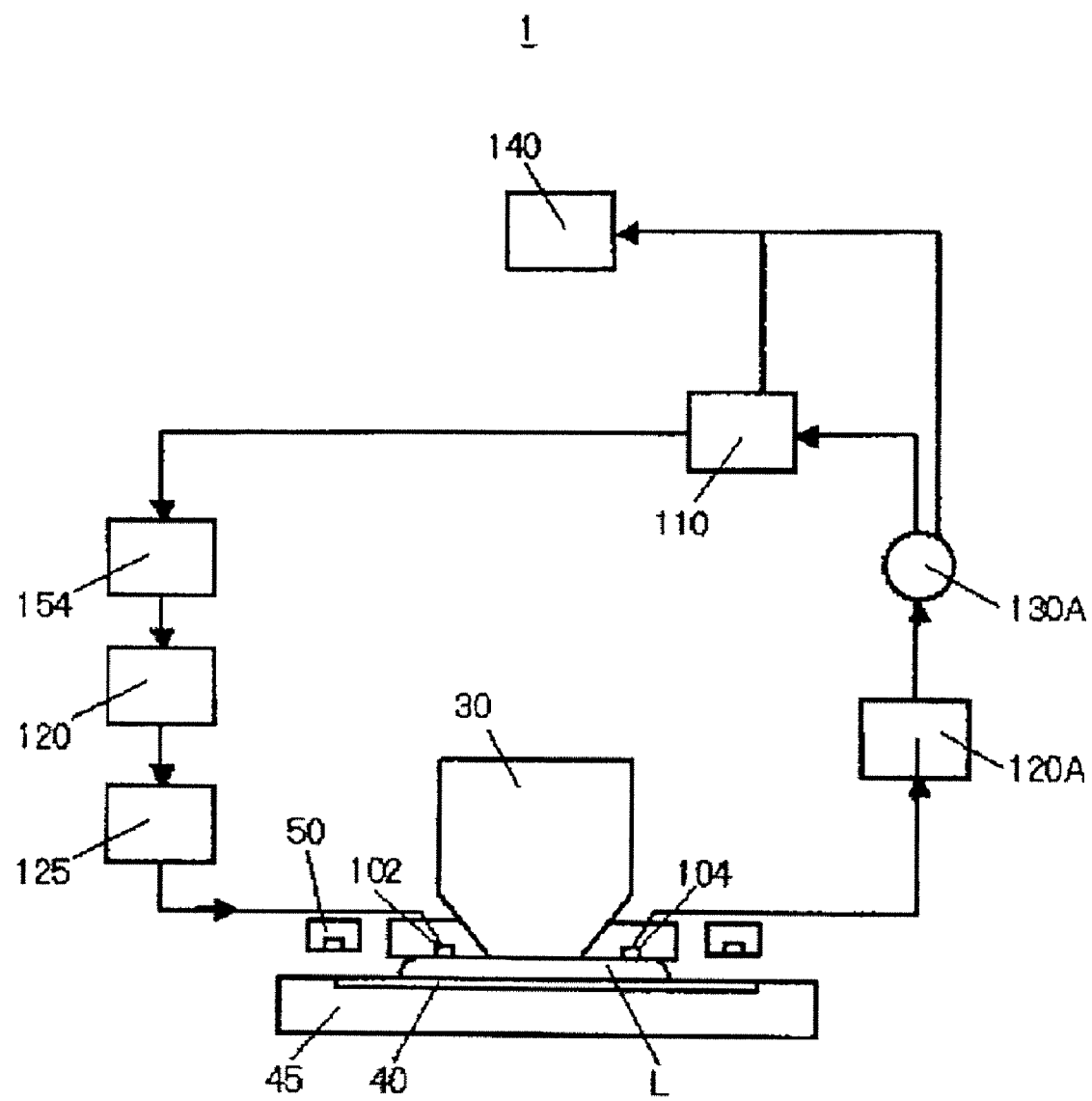
FIG. 4 is a partial block diagram that shows part of the structure of the exposure apparatus shown in FIG. 1.

As shown in FIG. 4, the circulator 100 of a third embodiment includes the oxygen removal unit 120, and the degassing unit 125, and further includes the measurement unit 130A between the purifier 110 and the exposure position used to expose the wafer 40. FIG. 4 is a partial block diagram that shows part of the structure of the exposure apparatus 1.

The exposure apparatus 1 of the third embodiment uses hydrocarbonaceous HRI liquid having a refractive index of 1.64 for the liquid L that is supplied to the space between the projection optical system 30 and the wafer 40.

In the exposure position of the exposure apparatus 1, the liquid L contacts the final lens of the projection optical system 30, wafer 40, the top plate of the wafer stage 45, and surrounding air, and its transmittance lowers. In particular, the photoresist is applied onto the wafer 40, and a material, such as the residue solvent in the photoresist, photoacid generator, and base, mixes in the liquid L, and the transmittance of the liquid L lowers. The environment around the exposure position in the exposure apparatus 1 is replaced with nitrogen by the oxygen diluter 50, but a small amount of oxygen that dissolves in the liquid L can lower the transmittance of the liquid L. In addition, since the KrF excimer laser and the ArF excimer laser for the exposure light have strong energy, it is feared that the combination of the liquid L breaks and the transmittance lowers consequently.

In the circulator 100 shown in FIG. 4, the oxygen removal unit 120A processes the liquid L recovered through the recovery nozzle 104 from the exposure position used to expose the wafer 40, and the measurement unit 130A measures its transmittance. The transmittance drop of the liquid L is caused, as discussed above, by the mixture of eluates, such as a photoresist, and a degradation of the liquid L itself due to the exposure light, and a mixture of oxygen. The purifier 110 mainly eliminates the eluates and the decomposition product. Therefore, the oxygen removal unit 120A sits in front of the measurement unit 130A so as to separate the transmittance drop of the liquid L due to the mixture of oxygen from other factors.

The measurement unit 130A of the third embodiment includes a D2 lamp as a light source, a diffraction grating that extracts the light having a wavelength of 193 nm from the light emitted from the D2 lamp, a fused silica cell that circulates the liquid L and transmits the measurement light, and a detector that detects the transmission light intensity. The fused silica cell is configured so that the liquid L to be measured has a thickness of 10 mm.

This embodiment is configured so that when the transmittance value per 10 mm thickness of the liquid L measured by the measurement unit 130A is 10% or greater, the liquid L is fed to the purifier 110, and when the transmittance value per 10 mm thickness of the liquid measured by the measurement unit 130A is below 10%, the liquid L is fed to the liquid-waste tank 140. The determination criterion value of the transmittance can be changed in accordance with the purification capability of the purifier 110.

When the transmittance value per 10 mm thickness of the liquid measured by the measurement unit 130A is 10% or greater, the purification condition of the purifier 110 is controlled in accordance with the measured transmittance value. The purification condition includes a process time period, the number of processes, and the process temperature of the purifier 110. For example, when the transmittance value is as low as about 20% per 10 mm thickness, the number of processes of the purifier 110 is set to five so that the transmittance of the liquid L sufficiently recovers. On the other hand, when the transmittance value is about 70% per 10 mm thickness, the number of processes of the purifier 110 is set to one.

The liquid L purified by the purifier 110 is stored in the supply tank 154. The liquid L supplied from the supply tank 154 is supplied through the oxygen removal unit 120, the degassing unit 125, and the supply nozzle 102 to the space between the projection optical system 30 and the wafer 40. The circulator 100 includes a liquid temperature controller (not shown), a particle filter (not shown), and a chemical filter (not shown) between the degassing unit 125 and the supply nozzle 102.

The wafer 40 is exposed with the exposure apparatus 1 that has the circulator 100 shown in FIG. 4, and an inspection reveals that its imaging characteristic is stable with no drifts at the best focus position. When a measurement unit similar to the measurement unit 130A is arranged subsequent to the oxygen removal unit 120 to inspect the transmittance stability of the liquid L, it is confirmed that the transmittance per 10 mm thickness is stable within a range of 80±3%.

When the measurement unit 130A that measures the transmittance of the liquid L is arranged between the exposure position and the purifier 110, the liquid L having an extremely low transmittance can be eliminated from the liquid L having a reduced transmittance at the exposure position. An elimination of the liquid L having a reduced transmittance can appropriately maintain the load to the purifier 110 and a purification effect. In addition, this embodiment can prevent contaminations (for example, of the purifier 110) in the apparatus caused by the liquid L having a reduced transmittance. Moreover, the purification condition of the purifier 110 can be controlled based on the transmittance value of the liquid L measured by the measurement unit 130A.

Thus, the measurement unit 130A between the exposure position and the purifier 110 provides precise quality control over the liquid L recovered from the exposure position. In addition, this embodiment provides an exposure apparatus that uses the liquid L having a reduced fluctuation of the transmittance by controlling a purification condition of the purifier 110 based on the transmittance value of the liquid L.

Fourth Embodiment

Figure 5:
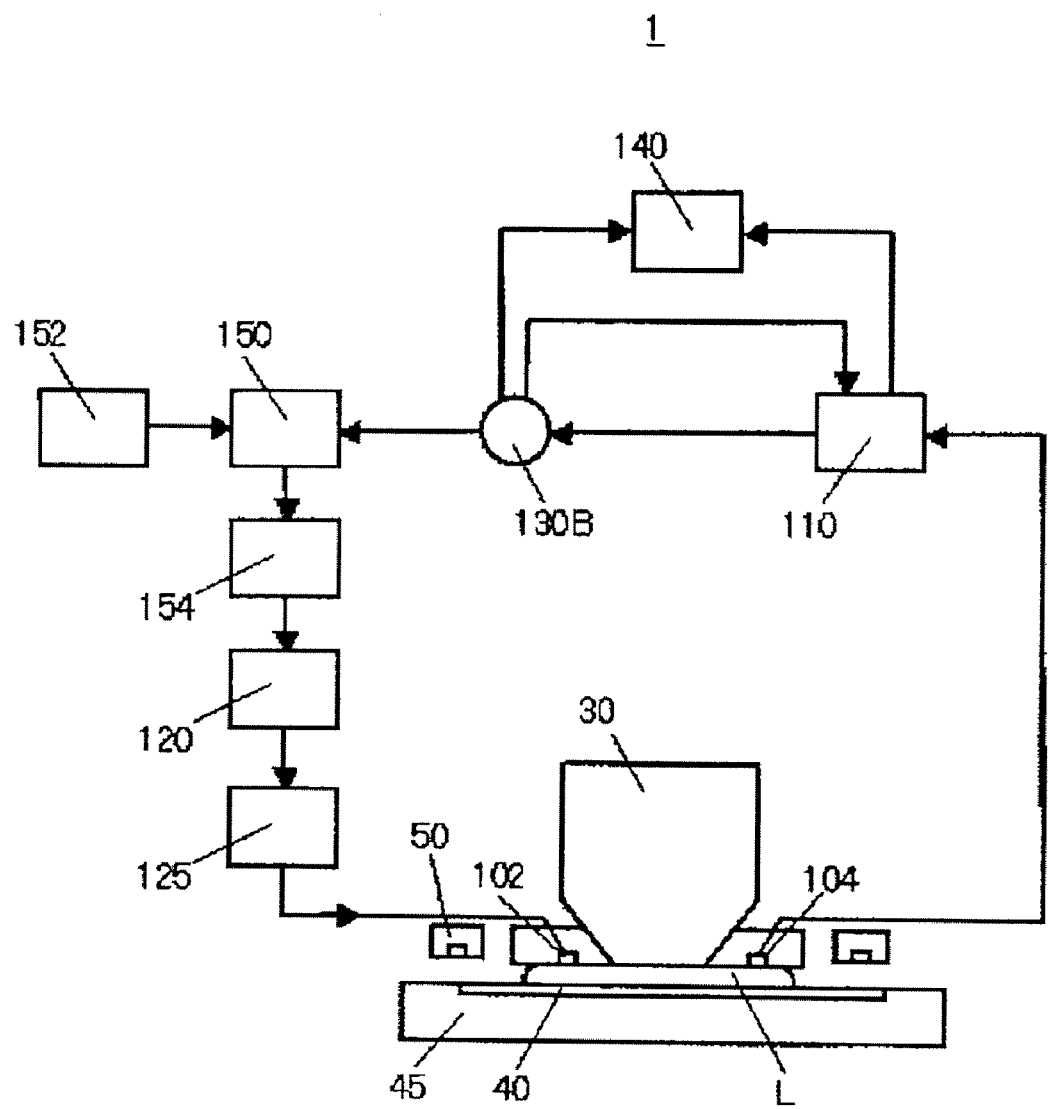
FIG. 5 is a partial block diagram that shows part of the structure of the exposure apparatus shown in FIG. 1.

The circulator 100 of a fourth embodiment includes, as shown in FIG. 5, a measurement unit 130B that measures the transmittance of the liquid L, between the purifier 110 and the mixer 150 that mixes the new liquid with the liquid L purified by the purifier 110. FIG. 5 is a partial block diagram that shows part of the structure of the exposure apparatus 1.

The exposure apparatus 1 of the fourth embodiment uses the hydrocarbonaceous HRI liquid having a refractive index of 1.64 for the liquid L that is supplied to the space between the projection optical system 30 and the wafer 40.

In the circulator 100 shown in FIG. 5, the purifier 110 purifies the liquid L recovered through the recovery nozzle 104 from the exposure position used to expose the wafer 40, and the measurement unit 130B measures its transmittance. The measurement unit 130B is similar to the measurement unit 130A of the third embodiment.

When the transmittance value per thickness of 10 mm of the liquid L in the measurement unit 130B is 75% or greater, the liquid L is fed to the mixer 150 and mixed with the new liquid. In that case, a mixture ratio between the new liquid and the purified liquid L is controlled based on the measured transmittance value so that the transmittance of the mixed liquid is 85% per 10 mm thickness.

When the transmittance value per 10 mm thickness of the liquid L in the measurement unit 130B is 50% or greater and smaller than 75%, the liquid L is fed back to the purifier 110 and purified. In that case, the purification condition, such as the number of processes, is controlled based on the measured transmittance.

When the transmittance value per 10 mm thickness of the liquid L in the measurement unit 130B is smaller than 50%, the recycle of the liquid L is determined difficult and the liquid L is fed to the liquid-waste tank 140.

The purified liquid L and the new liquid are mixed by the mixture 150, and stored in the supply tank 154. The liquid L supplied from the supply tank 154 is supplied through the oxygen removal unit 120 and the degassing unit 125 to the space between the projection optical system 30 and the wafer 40 via the supply nozzle 102. The circulator 100 includes a liquid temperature controller (not shown), a particle filter (not shown), a chemical filter (not shown), etc. between the degassing unit 125 and the supply nozzle 102.

The wafer 40 is exposed with the exposure apparatus 1 that has the circulator 100 shown in FIG. 5, and an inspection reveals that its imaging characteristic is stable with no drifts at the best focus position. When a measurement unit similar to the measurement unit 130B is arranged subsequent to the oxygen removal unit 120 to inspect the transmittance stability of the liquid L, it is confirmed that the transmittance per 10 mm thickness is stable within a range of 85±1%.

Thus, the measurement unit 130B between the purifier 110 and the mixer 150 provides precise quality control over the purified liquid L. In addition, an exposure apparatus that uses the liquid L having a reduced fluctuation of the transmittance can be provided by controlling a mixture ratio with the new liquid based on the transmittance value of the purified liquid L.

Fifth Embodiment

Figure 6:
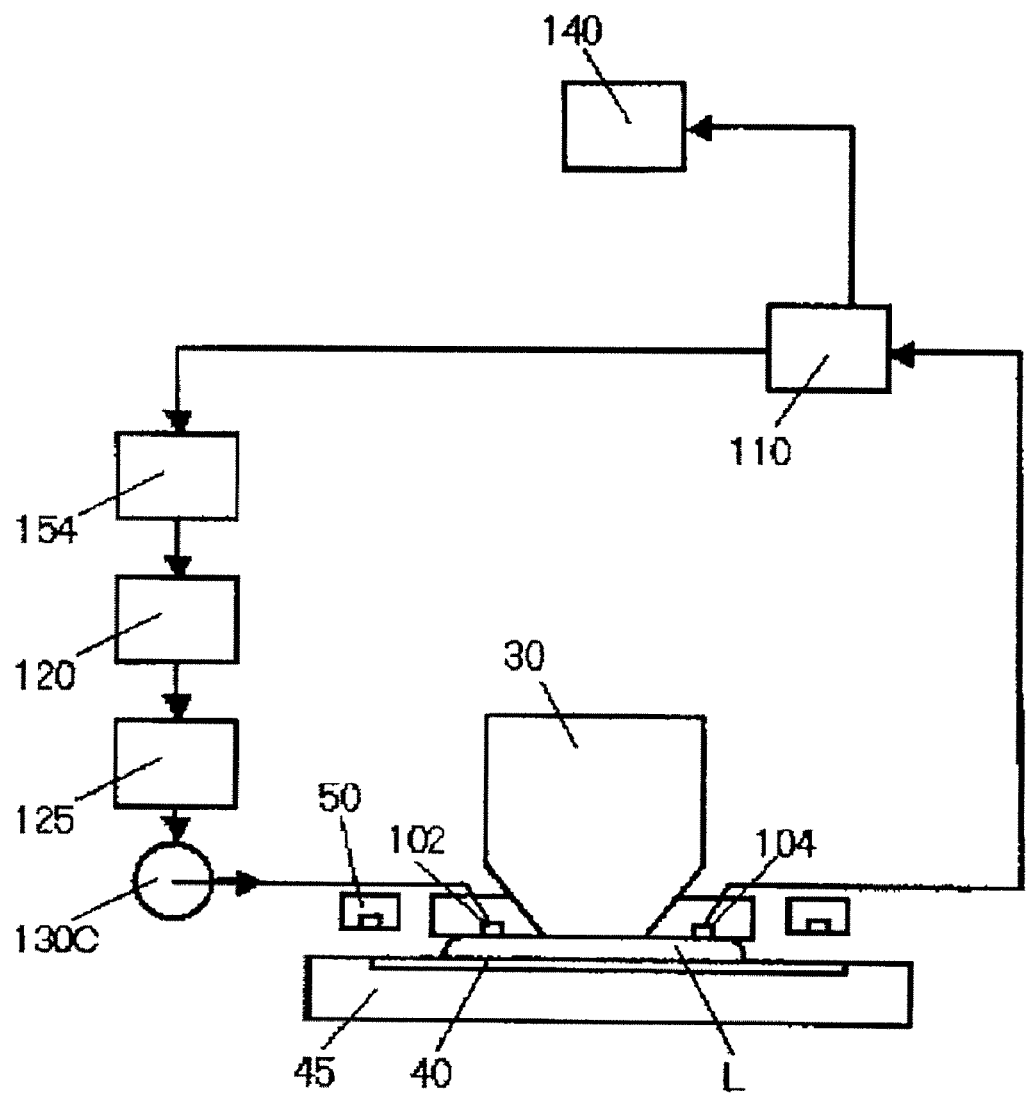
FIG. 6 is a partial block diagram that shows part of the structure of the exposure apparatus shown in FIG. 1.

The circulator 100 of a fifth embodiment includes, as shown in FIG. 6, a measurement unit 130C that measures the transmittance of the liquid L, between the oxygen removal unit 120 that removes the dissolved oxygen in the liquid L and the exposure position used to expose the wafer 40. FIG. 6 is a partial block diagram that shows part of the structure of the exposure apparatus 1.

The exposure apparatus 1 of the fifth embodiment uses the hydrocarbonaceous HRI liquid having a refractive index of 1.64 for the liquid L that is supplied to the space between the projection optical system 30 and the wafer 40.

In the circulator 100 shown in FIG. 6, the liquid L recovered through the recovery nozzle 104 from the exposure position used to expose the wafer 40 is purified by the purifier 110 and stored in the supply tank 154. The liquid L supplied from the supply tank 154 undergoes the oxygen removal unit 120 and the degassing unit 125, and the measurement unit 130C measures its transmittance.

The measurement unit 130C is similar to the measurement unit 130A of the third embodiment.

The liquid L whose transmittance is measured by the measurement unit 130C is supplied through the supply nozzle 102 to the space between the projection optical system 30 and the wafer 40. The circulator 100 includes a new liquid tank (not shown), a mixture (not shown) that mixes the new liquid with the purified liquid L, a liquid temperature controller (not shown), a particle filter (not shown), and a chemical filter (not shown).

The fifth embodiment corrects a focus position during exposure based on the measurement value of the transmittance of the measurement unit 130C. The correction value of the focus position is preferably determined uniquely to the transmittance value of the liquid L. However, the correction values of the focus and exposure dose may be necessary depending upon a positional relationship with adjacent shots and a distance from a scan exposure start position.

Control over the transmittance of the liquid L is crucial for the immersion exposure to in order to maintain the imaging characteristic. When the transmittance of the liquid L is measured just before it is supplied to the space between the projection optical system 30 and the wafer 40, the exposure can be stopped if the liquid L having a reduced transmittance should be supplied. In addition, an aberrational correction value, such as a focus position and an exposure dose, changes due to the transmittance of the liquid L. The amount of aberrational correction is controlled and the good imaging characteristic can be maintained by precisely measuring the transmittance of the liquid L.

The wafer 40 is exposed with the exposure apparatus 1 that has the circulator 100 shown in FIG. 6, and an inspection reveals that its imaging characteristic is stable. The transmittance value of the liquid L measured by the measurement unit 130C falls within a range of 80±5% per 10 mm thickness.

Thus, the measurement unit 130C between the oxygen removal unit 120 and the exposure position provides precise quality control over the liquid L supplied to the exposure position. In addition, an exposure apparatus having a good imaging characteristic can be provided by controlling the amount of aberrational correction based on the transmittance value of the liquid L.

Sixth Embodiment

Figure 7:
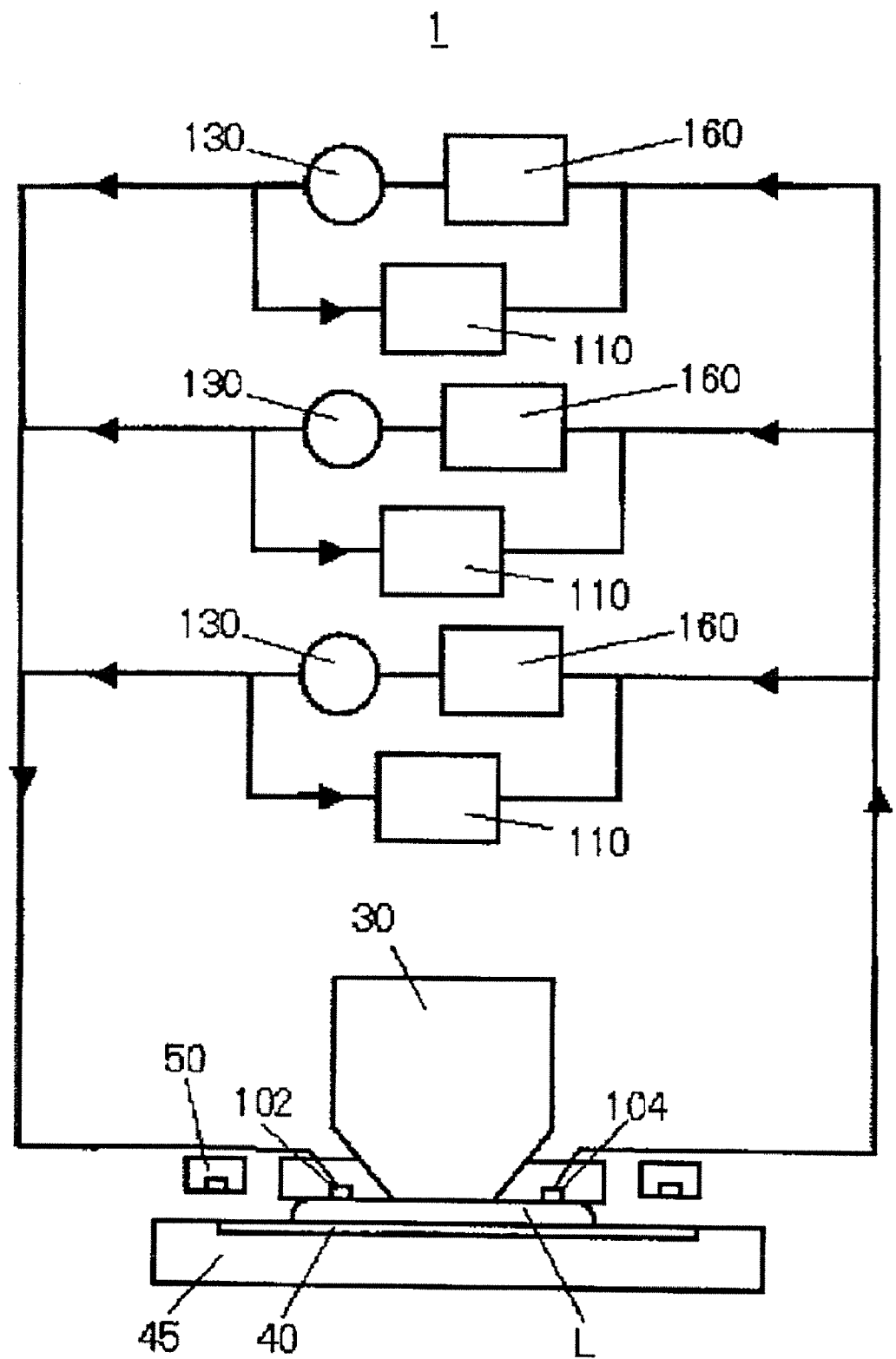
FIG. 7 is a partial block diagram that shows part of the structure of the exposure apparatus shown in FIG. 1.

A description will now be given of the exposure apparatus 1 of a sixth embodiment. FIG. 7 is a block diagram showing part of a structure of the exposure apparatus of the sixth embodiment.

The exposure apparatus 1 of the sixth embodiment temporarily stores, in a tank 160, the liquid recovered L from the space between the projection optical system 30 and the wafer 40, uses the measurement unit 130 to measure the transmittance of the liquid L stored in the tank 160, and controls the transmittance of the liquid L based on the measurement result of the measurement unit 130. The measurement unit 130 is similar to the measurement unit 130A of the third embodiment.

The exposure apparatus of the sixth embodiment includes plural tanks 160 as shown in a block diagram of FIG. 7. The purifier 110 and the measurement unit 130 for the transmittance of the liquid L for each tank 160 provides purification for each tank 160 until the transmittance of the collected liquid L restores.

The liquid L having a stable transmittance can be supplied to the exposure position by controlling the transmittance of the liquid L for each tank 160.

While FIG. 7 provides the measurement unit 130 for each tank 160, the number of tanks 160 does not have to be the same as the number of measurement units 130. One measurement unit 130 may be shared with plural tanks. Similarly, one purifier 110 may be shared with plural tanks.

The oxygen removal unit 120, such as a bubbler, may be provided in the tank 160. Since purification and oxygen removal can be performed for each tank, the transmittance can be precisely controlled. The transmittance of the liquid can be controlled by controlling the oxygen concentration contained in the bubbling gas. Control over the transmittance of the liquid with the dissolved oxygen concentration as a parameter can reduce the transmittance difference between tanks. As a result, a drastic change of the exposure condition can be restrained in switching a supply tank.

Seventh Embodiment

Figure 8:
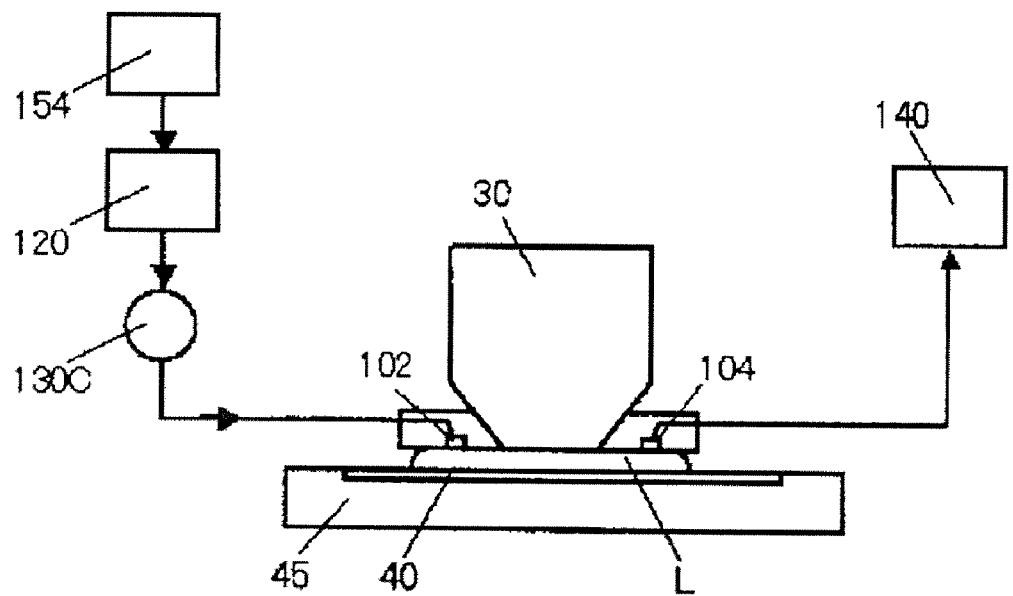
FIG. 8 is a partial block diagram showing part of an exposure apparatus according to one aspect of the present invention.

A seventh embodiment includes a measurement unit 130C that measures the transmittance of the liquid L, between the oxygen removal unit 120 that removes the dissolved oxygen in the liquid L and the exposure position used to expose the wafer 40. FIG. 8 is a partial block diagram showing part of a structure of the exposure apparatus 1A according to one aspect of the present invention.

The exposure apparatus 1A uses pure water having a refractive index of 1.44 for the liquid L that is supplied to the space between the projection optical system 30 and the wafer 40. The pure water as the liquid L does not have to be circulated or recycled, as shown in FIG. 8.

The liquid L stored in the supply tank 154 is fed to and processed by the oxygen removal unit 120, and the measurement unit 130C measures its transmittance.

The measurement unit 130C of the seventh embodiment includes a D2 lamp as a light source, a diffraction grating that extracts the light having a wavelength of 193 nm from the light emitted from the D2 lamp, a fused silica cell that circulates the liquid L and transmits the measurement light, and a detector that detects the transmission light intensity. The fused silica cell is configured so that the liquid L to be measured has a thickness of 20 mm.

The liquid L whose transmittance is measured by the measurement unit 130C is supplied through the supply nozzle 102 to the space between the projection optical system 30 and the wafer 40. The exposure apparatus 1A includes a liquid temperature controller (not shown), a particle filter (not shown), and a chemical filter (not shown), between the supply tank 154 and the supply nozzle 102.

The seventh embodiment corrects the focus position during exposure based on the measurement value of the transmittance by the measurement unit 130C. The correction value of the focus position is preferably determined uniquely to the transmittance value of the liquid L. However, the correction values of the focus and exposure dose may be necessary depending upon a positional relationship with adjacent shots and a distance from a scan exposure start position.

The wafer 40 is exposed with the exposure apparatus 1A while the focus position and the exposure dose are corrected, and an inspection reveals that its imaging characteristic is stable. The transmittance value of the liquid L measured by the measurement unit 130C falls within a range of 83±3% per 10 mm thickness.

Thus, the exposure apparatus 1 or 1A includes at least one of the measurement units 130A to 130C that measure the transmittance of the liquid L. Therefore, the exposure apparatus 1 or 1A can precisely control the transmittance of the liquid L, and reduce the fluctuation of the transmittance of the liquid L, realizing a superior exposure characteristic. The fluctuation of the transmittance of the liquid L can be further reduced by arranging the measurement unit at two ore more positions between the exposure position and the purifier 110, between the purifier 110 and the mixer 150, and between the oxygen removal unit 120 and the exposure position.

When the liquid L from the external liquid supply/recovery apparatus is supplied to the exposure apparatus 1, the exposure apparatus 1 does not have to include the measurement units 130A to 130C, or the circulator 100. For example, when the external liquid supply/recovery apparatus is configured to be a circulator similar to the above circulator 100 so that the liquid supply/recovery apparatus can measure the transmittance of the liquid L, the transmittance of the liquid may be controlled based on the measurement result. One aspect of the present invention rests in an exposure system that includes an exposure apparatus that exposes the wafer via the liquid L supplied to the space between the projection optical system and the wafer, the measurement unit that measures the transmittance of the liquid L, and the circulator that circulates the liquid L supplied to the exposure apparatus.

The exposure apparatus 1 provides a measurement method for adjusting the transmittance of the liquid L in circulating the liquid L by measuring the transmittance of the recovered liquid L, and by controlling a purification condition of the purifier 110 or a mixture ratio of the mixer 150 based on the measurement result. This exposure method can maintain the transmittance of the liquid L constant, and exhibits an effect similar to the exposure apparatus 1.

In exposure, the light is emitted from the light source section illuminates the reticle 20 via the illumination optical system. The reticle 20's pattern is imaged onto the wafer 40 by the projection optical system 30 via the liquid L. The transmittance of the liquid L used for the exposure apparatus 1 or 1A is precisely controlled, and the fluctuation of the transmittance that affects the exposure characteristic is reduced. Therefore, the exposure apparatus 1 or 1A can provide high-quality devices, such as semiconductor devices and LCD devices, with high throughput and economic efficiency.

In the above embodiments, the exposure apparatus includes the circulator 100 that circulates the liquid between the recovery nozzle 104 and the supply nozzle 102. However, the circulator 100 may be provided outside the exposure apparatus to make an exposure system of the exposure apparatus and the circulator.

Figure 9:
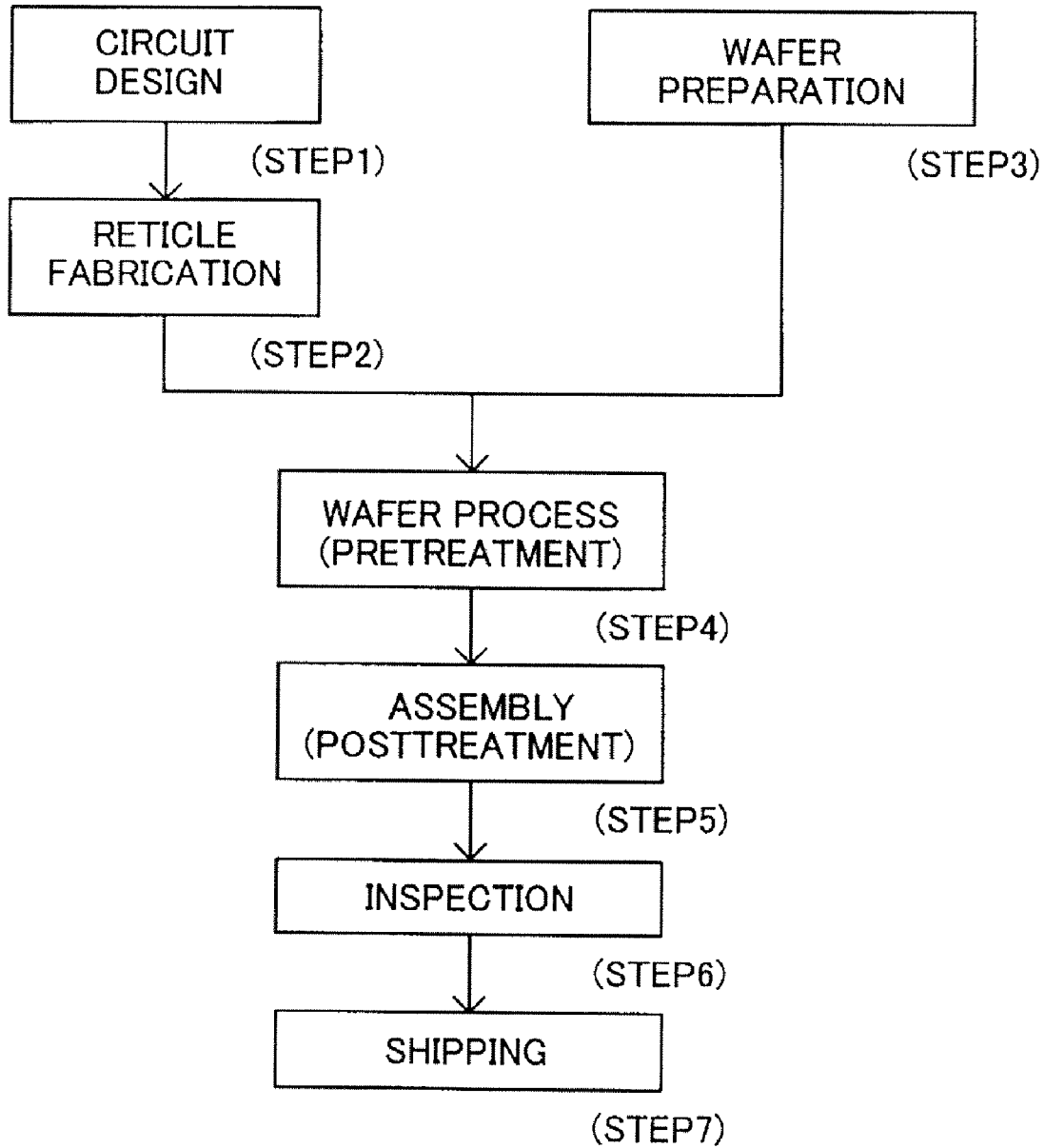
FIG. 9 is a flowchart for explaining a fabrication of a device.
Figure 10:
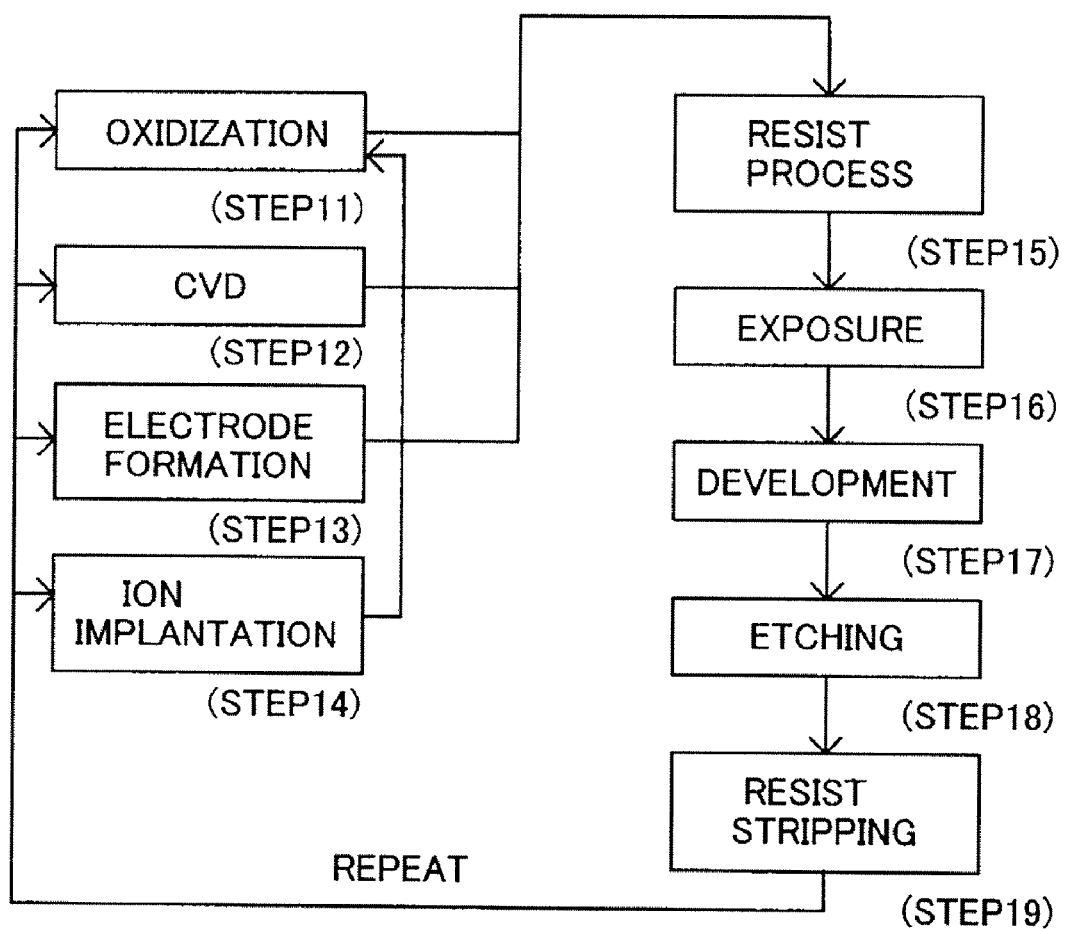
FIG. 10 is a flowchart for a wafer process of step 4 shown in FIG. 9.

Referring now to FIGS. 9 and 10, a description will be given of an embodiment of a device manufacturing method using the exposure apparatus 1 or 1A. FIG. 9 is a flowchart for explaining how to fabricate devices, such as a semiconductor device and a LCD device. Here, a description will be given of the fabrication of a semiconductor device as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 10 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 or 1A to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device manufacturing method of this embodiment may manufacture higher quality devices than ever. Thus, the above device manufacturing method can provide a higher quality device than ever.

Further, the present invention is not limited to these preferred embodiments and various variations and modifications may be made without departing from the scope of the present invention.

This application claims a foreign priority benefit based on Japanese Patent Applications Nos. 2006-037423, filed on Feb. 15, 2006, 2006-353587, filed on Dec. 28, 2006, and 2007-026405, filed on Feb. 6, 2007, which is hereby incorporated by reference herein in its entirety as if fully set forth herein.

What is claimed:

1. An exposure apparatus comprising:
a projection optical system configured to project an image of a reticle pattern onto a substrate, said exposure apparatus exposing the substrate via liquid supplied to a space between the substrate and the projection optical system; and
a liquid circulator system configured to supply the liquid to the space between the substrate and the projection optical system,
wherein the liquid circulator system comprises:
an oxygen removal unit configured to reduce dissolved oxygen in the liquid by bringing the liquid into contact with a gas other than oxygen; and
a degassing unit configured to reduce a dissolved gas in the liquid processed by the oxygen removal unit.

2. An exposure apparatus according to claim 1, further comprising an oxygen diluter configured to provide an atmosphere having an oxygen concentration lower than air by supplying the gas other than oxygen around the liquid supplied to the space between the projection optical system and the substrate.

3. An exposure apparatus according to claim 2, wherein the gas used for the oxygen removal unit is different in type from that supplied by the oxygen diluter.

4. An exposure apparatus according to claim 3, wherein the gas used for the oxygen removal unit is helium, and the gas supplied by the oxygen diluter is nitrogen.

5. An exposure apparatus according to claim 1, wherein the oxygen removal unit includes a bubbler configured to reduce the dissolved oxygen by bubbling the gas other than oxygen.

6. An exposure apparatus according to claim 1, further comprising a degassing filter that reduces the dissolved gas by flowing the liquid in one end of a gas transmitting filter and by decompressing the other end.

7. An exposure apparatus according to claim 1, wherein the degassing unit is arranged between the oxygen removal unit and an exposure position used to expose the substrate.

8. An exposure apparatus according to claim 1, further comprising a measurement unit configured to measure a transmittance of the liquid.

9. An exposure apparatus according to claim 8, wherein the measurement unit is arranged on a downstream side of the oxygen removal unit.

10. An exposure apparatus according to claim 8, wherein said exposure apparatus controls a dissolved oxygen concentration in the liquid, and adjusts a transmittance of the liquid based on a measurement result of the measurement unit.

11. An exposure apparatus according to claim 8, further comprising a purifier configured to improve a purity of the liquid recovered from the space between the projection optical system and the substrate, wherein the measurement unit is arranged between the purifier and an exposure position used to expose the substrate, and wherein based on a measurement result of the measurement unit, said exposure apparatus determines whether the liquid recovered from the space between the projection optical system and the substrate is to be recycled, and controls a purification condition of the purifier.

12. An exposure method configured to expose a substrate via liquid supplied to a space between the substrate and a projection optical system, said method comprising the step of circulating the liquid that is supplied to the space between the substrate and the projection optical system, said circulating step including the steps of:

reducing dissolved oxygen by bringing the liquid into contact with a gas other than oxygen in the liquid recovered from the space between the substrate and the projection optical system; and reducing a dissolved gas in the liquid processed by the dissolved oxygen reducing step.

13. An exposure system comprising:

an exposure apparatus that includes a projection optical system configured to project an image of a reticle pattern onto a substrate, and exposes the substrate via liquid supplied to a space between the substrate and the projection optical system; and a circulator configured to circulate the liquid that is supplied to the space between the projection optical system and the substrate, the circulator including an oxygen removal unit configured to reduce dissolved oxygen in the liquid by bringing the liquid into contact with a gas other than oxygen, and a degassing unit configured to reduce a dissolved gas in the liquid processed by the oxygen removal unit.

* * * * *